US008759830B2

(12) United States Patent
Tessler et al.

(10) Patent No.: US 8,759,830 B2
(45) Date of Patent: Jun. 24, 2014

(54) VERTICAL ORGANIC FIELD EFFECT TRANSISTOR AND METHOD OF ITS MANUFACTURE

(75) Inventors: Nir Tessler, Zichron Yaakov (IL); Ariel Ben-Sasson, Haifa (IL)

(73) Assignee: Technion Research and Development Foundation Ltd., Technion (IL)

( * ) Notice: Subject to any disclaimer, the term of this patent is extended or adjusted under 35 U.S.C. 154(b) by 126 days.

(21) Appl. No.: 13/259,397

(22) PCT Filed: Apr. 6, 2010

(86) PCT No.: PCT/IL2010/000286
§ 371 (c)(1),
(2), (4) Date: Dec. 28, 2011

(87) PCT Pub. No.: WO2010/113163
PCT Pub. Date: Oct. 7, 2010

(65) Prior Publication Data
US 2012/0097949 A1    Apr. 26, 2012

Related U.S. Application Data (66) Substitute for application No. 61/164,442, filed on Mar. 29, 2009.

(60) Provisional application No. 61/235,048, filed on Aug. 19, 2009.

(51) Int. Cl.
H01L 29/04    (2006.01)
H01L 29/10    (2006.01)
H01L 27/12    (2006.01)
H01L 29/66    (2006.01)
H01L 29/786   (2006.01)

(52) U.S. Cl.
CPC ....... *H01L 27/1214* (2013.01); *H01L 29/66757* (2013.01); *H01L 27/12* (2013.01); *H01L 29/66765* (2013.01); *H01L 29/78696* (2013.01)
USPC ........................................................... 257/57

(58) Field of Classification Search
CPC ................... H01L 27/1214; H01L 29/66757; H01L 27/12; H01L 29/66765; H01L 29/78696
USPC ........................................................... 257/57
See application file for complete search history.

(56) References Cited

U.S. PATENT DOCUMENTS

2004/0113152 A1    6/2004  Kim et al.
2008/0041818 A1    2/2008  Kihara et al.
2009/0008634 A1*   1/2009  Tessler et al. ................... 257/40

FOREIGN PATENT DOCUMENTS

WO    WO 2005/024907 A2    3/2005
WO    WO 2007/080575 A1    7/2007

(Continued)

OTHER PUBLICATIONS

Ben-Sasson et al., "Patterned Electrode Vertical Field Effect Transistor Fabricated Using Block Copolymer Nanotemplates," *Applied Physics Letters*, 2009, pp. 213301.1-213301.3, vol. 95-No. 21, American Institute of Physics.

(Continued)

*Primary Examiner* — Anthony Ho
(74) *Attorney, Agent, or Firm* — Oliff PLC (57) ABSTRACT

An electronic device (100) is presented, being configured for example as a vertical field effect transistor. The device comprises an electrically-conductive perforated patterned structure (102) which is enclosed between a dielectric layer (105) and an active element (106) of the electronic device (100). The electrically-conductive perforated patterned structure (102) comprises a geometrical pattern defining an array of spaced-apart perforation regions (108) surrounded by continuous electrically conductive regions (110). The pattern is such as to allow the active element (106) of the electronic device (100) to be in direct contact with said dielectric layer (105) aligned with the perforation regions (108). A material composition of the device (100) and features of said geometrical pattern are selected to provide a desired electrical conductance of the electrically-conductive perforated patterned structure (102) and a desired profile of a charge carriers' injection barrier along said structure (102).

10 Claims, 9 Drawing Sheets

(56) References Cited

FOREIGN PATENT DOCUMENTS

WO   WO 2007/080576 A1   7/2007
WO   WO 2009/036071 A2   3/2009

OTHER PUBLICATIONS

Ma et al., "Unique Architecture and Concept for High-Performance Organic Transistors," *Applied Physics Letters*, 2004, pp. 5084-5086, vol. 85-No. 21, American Institute of Physics.

Castelletto et al., "Morphologies of Block Copolymer Melts," *Current Opinion in Solid State & Materials Science*, 2005, pp. 426-438, vol. 8, Elsevier Ltd.

Tapponnier et al., "Ultrapure C60 Field-Effect Transistors and the Effects of Oxygen Exposure," *Applied Physics Letters*, 2005, pp. 112114.1-112114.3, vol. 86, American Institute of Physics.

Ma et al., "Solid-state Supercapacitors for Electronic Device Applications," *Applied Physics Letters*, 2005, pp. 123503.1-123503.3, vol. 87, American Institute of Physics.

Nakayama et al., "High-current and Low-voltage Operation of Metal-base Organic Transistors with LiF/Al Emitter," *Applied Physics Letters*, 2006, pp. 153512.1-153512.3, vol. 88, American Institute of Physics.

Park et al., "Enabling Nanotechnology with Self Assembled Block Copolymer Patterns," *Polymer*, 2003, pp. 6725-6760, vol. 44, Elsevier Ltd.

Abetz et al., "Phase Behaviour and Morphologies of Block Copolymers," *Advance Polymer Science*, 2005, pp. 125-212, vol. 189, Springer-Verlag Berlin Heidlelberg, Germany.

Xu et al., "Vertical Organic Light Emitting Transistor," *Applied Physics Letters*, 2007, pp. 092911.1-092911.3, vol. 91, American Institute of Physics.

Stutzmann et al., "Self-Aligned, Vertical-Channel, Polymer Field-Effect Transistors," *Science*, 2003, pp. 1881-1884, vol. 299, American Association for the Advancement of Science, Washington, D.C.

Chen et al., "Light-Emitting Polymer Space-Charge-Limited Transistor," *Applied Physics Letters*, 2008, pp. 223301.1-223301.3, vol. 93, American Institute of Physics.

Kudo et al., "Organic Static Induction Transistor for Display Devices," *Synthetic Metals*, 2000, pp. 11-14. vol. 111-112, Elsevier Science S.A.

Koezuka et al., "Field-Effect Transistor with Polythiophene Thin Film," *Synthetic Metals*, 1987, pp. 699-704, vol. 18, Elsevier Sequoia, Printed in The Netherlands.

\* cited by examiner

VERTICAL ORGANIC FIELD EFFECT TRANSISTOR AND METHOD OF ITS MANUFACTURE

FIELD OF THE INVENTION

This invention is in the field of organic field effect transistors (OFETs), and relates to a vertical-design OFET and a method of its manufacture.

REFERENCES

The following references are considered to be pertinent for the purpose of understanding the background of the present invention:
1. L. P. Ma and Y. Yang, "Unique architecture and concept for high-performance organic transistors," Applied Physics Letters, vol. 85, pp. 5084-5086, 2004.
2. Volker Abetz, Peter F. W. Simon "Phase Behavior and Morphologies of Block Copolymers", Adv Poly. Sci. 189: 125-212 (2005)
3. V. Castelletto, I. W. Hamley, "Morphologies of block copolymer melts" Solid State and Materials Science 8 (2004) 426-438
4. A. Tapponnier, I. Biaggio, and P. Gunter, "Ultrapure C60 field-effect transistors and the effects of oxygen exposure" APPL. PHYS. LET. 86, 112114 (2005)
5. Liping Ma and Y. Yang, "Solid-state supercapacitors for electronic device applications" Appl. Phys. Let. 87, 123503 (2005)
6. Ken-ichi Nakayama, Shin-ya Fujimoto, Masaaki Yokoyama, "High-current and low-voltage operation of metal-base organic transistors with LiF/Al emitter" Appl. Phys. Let. 88, 153512 (2006)
7. Zheng Xu, Sheng-Han Li, Liping Ma, Gang Li, and Y. Yang, "Vertical organic light emitting transistor", Appl. Phys. Let. 91, 092911 (2007)
8. Natalie Stutzmann, Richard H. Friend, Henning Sirringhaus, "Self-Aligned, Vertical-Channel, Polymer Field-Effect Transistors" APPL. PHYS. LET. 86, 112114 (2005)
9. Chun-Yu Chen, Yu-Chiang Chao, Hsin-Fei Meng and Sheng-Fu Horng, "Light-emitting polymer space-charge-limited transistor" APPL. PHYS. LETT. 93, 223301 (2008)

BACKGROUND OF THE INVENTION

Organic materials in general are composed of carbon backbone hybridized in sp2 configuration allowing delocalization of electrons through overlapping $\pi$ bonds. This group of materials is divided to two groups. The first is the conjugated polymers (CPs) which comprise materials such as polythyophene and poly phenylenevinylene (PPV). The second group is of small molecules as pentacene and C60 buckminsterfullerene.

Organic Field Effect Transistors (OFETs) were first introduced by Koezuka et al. at 1987. The general operation architecture of the organic FETs resembles that of the inorganic FETs [5]. Basically, a bottom electrode serves as the gate electrode and a dielectric layer is placed on top of the gate. Metal electrodes serve as drain and source and between them an organic active layer is placed. When positive(/negative) potential is applied on the gate, negative(/positive) charge is accumulated on the other side of the dielectric layer thus creating a channel in the active layer between the electrodes. OFETs have drawn a growing attention due to, potentially low-cost fabrication methods, flexibility and large area production amenability.

However, the organic materials suffer from low mobility compared to inorganic materials. For example, silicon mobility for electrons is around 1400 $[cm^2 v^{-1} s^{-1}]$ and for holes around 450 $[cm^2 v^{-1} s^{-1}]$. This difference of five to six orders of magnitude is the cause of the disadvantages of these devices, low ON-current, high active voltage and low working frequency.

Different approaches have been taken in order to improve OFETs performance. These include improving the organic active layer mobility, the contacts resistance, the dielectric/active layer interface traps and the dielectric layer capacitance. Other groups focused on vertical architectural solution. In vertical type FET, the length of the channel is defined as the active layer or insulator thickness. Stuzmann at al. [8] proposed V-shaped transistor by solid state embossing of a pre-prepared metal-insulator-metal layers, a master with protruding edges and deposition of active, dielectric and contact layers on top. The channel length in this case is defined by the thickness of the insulating polymer between the two metal electrodes. Kudu at al. fabricated Organic Static Induction Transistor (SIT). The transistor structure of metal drain, organic active layer, Al grid gate, organic active layer and metal source resembles the electric vacuum tube principle of Ambrose Fleming from 1904. This device active layer thickness defines the channel length. One of its advantages is the easy integration of this structure to light emitting purposes [9].

Figure 1A:
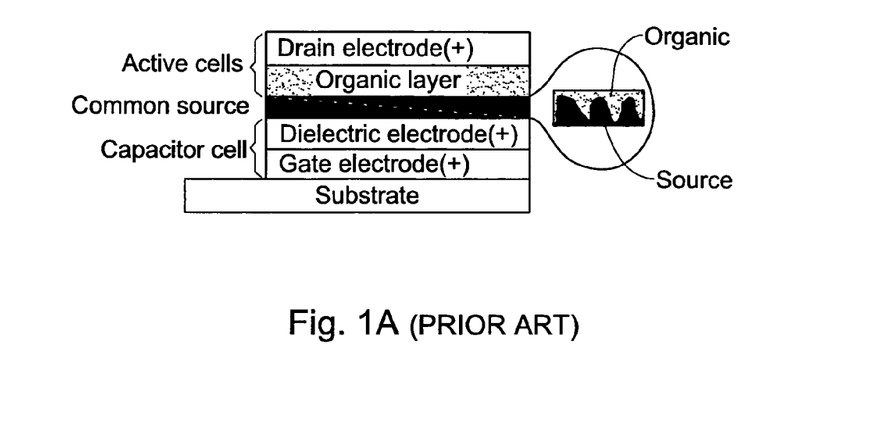
FIGS. 1A-1C are schematic diagrams of examples of conventional VOFET structures.

Vertical organic field effect transistors (VOFETs) have been developed [1], in which a gate electrode is placed below a source electrode and is separated from an active region of the transistor by an insulating (dielectric) layer. The Vertical Stacked FET in which the layers are stacked vertically is illustrated in FIG. 1A. The vertical FET comprises a gate, a dielectric layer, a source, an active layer and a drain. The transistor operation relies on two main characteristics. The first is the common source rough and ultra-thin structure and the second is the capacitor cell's high capacitance. The thin and rough source enables the gate to attract charges from the metal layer to the organic semi-conductor due to energy band bending. This approach relies on making a thin and yet generally conducting metallic electrode, where an active cell, formed by source and drain electrodes with an organic layer therebetween, is placed on top of a capacitor cell (gate on insulator). This transistor utilizes, for the source electrode, a highly non uniform film in that it has thin and thick regions. However, this transistor design suffers from the need to produce the source electrode with a finely tuned roughness (i.e., optimization of thin versus thick properties of the film), which lowers reproducibility of these results.

These devices, however, relied on an ultra-thin (<20 nm) aluminum source electrode that required careful partial oxidation. While such devices exhibited about 6 orders of magnitude current modulation, the low work-function aluminum source electrode required an n-type active channel restricting the device to the use of $C_{60}$ as the channel material.

The high capacitance, enhanced by Cu/LiF/Cu layers (ionic capacitance) [6], facilitates a considerable charge accumulation in the active layer surface. The device, having short channel length, the thickness of the active layer, and large channel width, size comparable to the layer surface, exhibits large ON-current that facilitates the use of this device as OLED pixel driver. This promising architecture was followed by others [7].

Figure 1B:
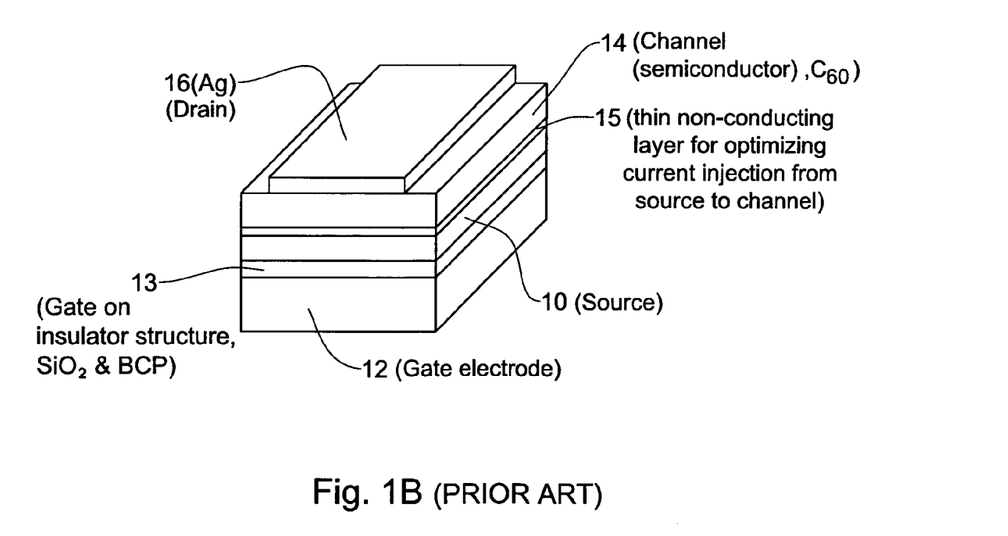
Figure 1C:
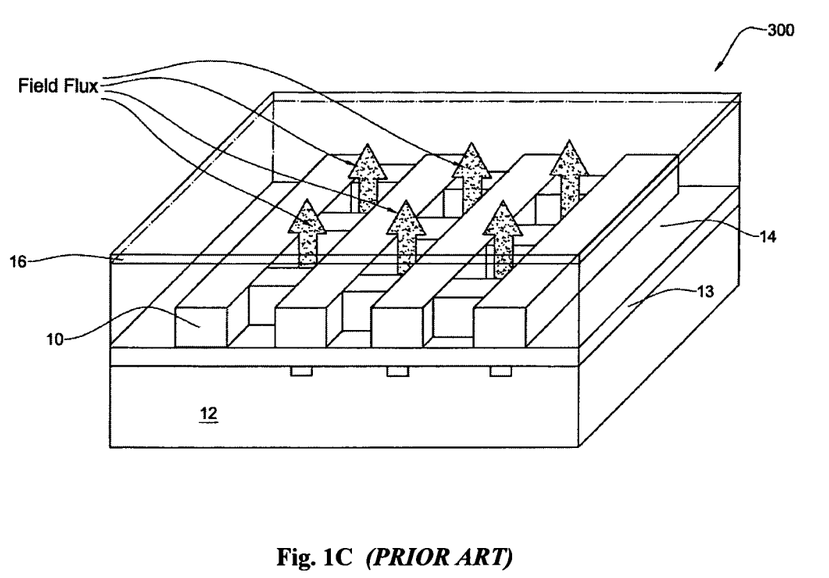

Another approach for VOFETs has been developed by the co-inventor of the present application and is described for example in WO 2007/080575 and WO 2007/080576, both assigned to the assignee of the present application. According to this technique, the VOFET comprises a "common electrode" (e.g. source) being patterned, i.e. being formed with an array of perforations (through going holes), enclosed between, a gate-on-insulator structure 13 and an active cell structure. The gate-on-insulator structure 13 is formed by a dielectric layer and a block copolymer (BCP) thin film thereon, such that the insulator material serves also as a template for the patterned electrode. This is schematically illustrated in FIGS. 1B and 1C. As shown, the grid-like source electrode allows the gate field flux to penetrate the source electrode layer at spaces in between the electrically conductive regions of the source electrode. The field flux attracts charge carriers from the source metal to the exposed regions at the semiconductor-insulator interface in a manner very similar to that of filling the channel in a lateral OFET. Due to the fact that the source electrode metal is chosen such that there is a barrier to charge injection into the semiconductor, adjusting the gate electrode voltage provides the required electric field to lower this injection barrier.

Block copolymers are a class of macromolecules produced by joining two or more distinct polymer blocks. Block copolymers comprise two or more homopolymer subunits linked by covalent bonds. The union of the homopolymer subunits may require an intermediate non-repeating subunit, known as a junction block. Block copolymers with two or three distinct blocks are called diblock copolymers and triblock copolymers, respectively. In the BCP, each block is composed of identical monomers and tied covalently to the other block in linear formation or in other formations like branch- or star-formation [2]. The chemically distinct blocks have different affinity to each other and promote separation, similar to an effect occurring when oil is introduced to water, but in the BCP case the covalent link exists between the two un-matching blocks that forces the proximity between them; this bond prevents macro phase separation and obliges phase separation in the molecular length scales (5-100 nm) termed mesophases, micro-phases or nanophases. Also, in the BCP case (as compared to the oil/water allegory), the size and structure complexity of the blocks play also a major role.

General Description

There is a need in the art in a novel electronic switch device enabling desirably high ON/OFF ratio (up to $1\times10^7$ and higher) and high ON-current (in the range of tens to hundreds of $mA/cm^2$), while with a higher flexibility for selection of the layout of the structure from both the energy and geometry points of view. More specifically, the invention is used for the implementation of a VFET structure, and is therefore described below with respect to this specific application. It should however be understood that the general principles of the invention are not limited to this application. It should also be understood that the principles of the invention can be used for organic, amorphous based or the like vertical field effect transistors (e.g. polysilicon, or amorphous silicon, or polymer layer), and therefore the term "VOFET" in the description below should not be interpreted as limited to vertical "organic" application only.

The device of the invention (VFET structure) is of the kind utilizing a patterned electrode structure (e.g. source) enclosed between a dielectric layer (being that of a gate-on-dielectric structure) and an active element of the device (organic semiconductor of the active cell, or amorphous semi-conductors as amorphous silicon or oxides ($TiO_2$, $Al_2O_3$)).

The invention is aimed at optimizing the charge carriers' injection into the active element by appropriately selecting a material composition and the geometrical pattern in the electrode structure to provide sufficient electrical conductance of the electrode and the energy barrier profile along an interface between the gate dielectric and the active element through the perforated source electrode, defined by the desired charge carrier's injection to the active element to be obtained.

The current continuity equations for the active layer and the carriers' injection at the electrode (drain or gate) are determined by the energy barrier profile. More specifically, the injection of carriers is ideally only from the source electrode. The gate electrode is ideally isolated with the dielectric layer and the drain provides only OFF-current which can be minimized through appropriate selection of materials. The latter depends on the following: the materials' energy levels (working functions), an electric field through the channel (active element), the profile of an electric potential and the carrier concentration (charge density) in this area.

VOFET architecture with vertically stacked layers (Gate/Insulator/Source/Active Layer/Drain) [1] facilitates high ON-current due to short channel length (L, active layer thickness) and large channel width (W, comparable to the transistor area). Unlike other designs, patterned electrode structure allows a thicker layer with a better control on the different parameters and less dependence on the super capacitance characteristics of the gate/dielectric/source; hence it facilitates high frequency operation. The combination of these two parameters (VOFET architecture and patterned electrode structure) enables to use such device for integrated organic electronic devices (e.g. RFID) as well as OLED display pixel drivers.

Patterned electrode structure concept, reinforced by numerical simulation, predicts the creation of channels in the layer gaps, resulting from band-bending between the source material (metal) and the active cell. Creating the patterned electrode structure, with gaps (perforations) measured in tens of nanometers, necessitates unconventional techniques such as soft lithography.

The main idea of the invention is based on the understanding of the following: The parameters of source electrode (common electrode) structure enclosed between the gate dielectric and active cell such as material composition, as well as a material pattern at the interface between the active cell and gate dielectric defined by the perforated source electrode, and the geometry (thickness, lateral size of pattern features (perforations) and fill factor of the perforations) affect the electrical conductance of the patterned electrode and the charge carriers' injection barrier profile. Accordingly, these parameters should be appropriately selected to provide the conductance and barrier profile.

More specifically, the thickness of the source electrode should be selected to be as thinner as possible but has to still provide enough conductance properties which in turn provide charge carrier to the entire electrode area. For example, the electrode thickness can be made as thin as 3 nm. When other restrictions such as the need for more than one layer and the use of adhesion layers underneath and between different layers of the active cell are taken into account, the source electrode thickness varies between 3 nm and 15 nm in total thickness. The two lateral parameters, the fill factor (FF) and the holes diameter are determined under some constraints. The FF is limited by the need for conductance on the electrode plane and may be determined for to be in the range of between 20% and 50%. A larger FF requires more precise patterning methods. The diameter of the holes can be varied between 10 nm to over 100 nm and is mostly limited by the dielectric thickness. For a thick dielectric layer, larger perforation/hole diameter is needed (deduced from scaling limits of lateral FETs and numerical simulations).

The patterned electrode parameters of interest are the electrode thickness, the fill factor (FF) of the perforations, which is defined as the ratio of the perforations/holes surface area to the rest of the surface area of the electrode structure, and also the lateral size of the perforations/holes. The desired profile of the charge carriers' injection barrier is such that the charge carriers' injection from the patterned source to the active cell semiconductor at the perforated regions (i.e. actually from the side walls of the perforations across the source electrode structure) is much higher than that from the source electrode regions in between the perforations to the active cell semiconductor, while not affecting the electrical conductivity along the patterned electrode. Generally speaking, the charge carriers' injection from the metallic (electrically-conductive) regions of the source electrode to the active cell semiconductor should be minimized as much as possible such that these regions in this respect are practically non-conductive.

The inventors have found that the above conditions can be satisfied by, on the one hand, appropriately selecting the material composition of the device (in particular the gate dielectric, the source, and the active cell semiconductor), and on the other hand by appropriately selecting the patterned features. It is important to note that the ability of selecting the material composition allows for optimizing the pattern geometry (controlling the source and dielectric thicknesses, the lateral dimension of the perforation, and their number). For example, the patterned electrode structure may be a single material layer or a multi-layer structure thus introducing the electrical conductivity profile across the source electrode, which in turn can be adjusted to provide the required charge carrier's injection at different regions of the source electrode (perforations and spaces between them).

In this connection, the inventors have found that by eliminating such a limitation of the patterning procedure as that associated with the use of a template (and especially a patterned template), allows for even more optimizing the selection of the material(s) for the source electrode, as well as that of a dielectric layer therebelow (its material and geometry). It should be understood that this dielectric layer also plays a role in the charge carriers' injection barrier profile. This is because in the VOFET structure of the present invention, the active cell semiconductor becomes in direct contact with the dielectric layer within the perforation regions of the patterned source electrode. This dielectric layer should preferably be as thin as possible to thereby reduce a distance between the gate and the active cell. The invented technique allows for a single-layer (or single-material) dielectric, thus enabling to make it thinner. On the other hand, the present invention does not utilize any template for the patterned source electrode thus even more increasing the flexibility of the dielectric layer thickness.

The thinner this dielectric layer is, the smaller may be the lateral dimension of the perforations. On the other hand, the use of perforations with the smaller lateral dimension allows to increase the surface area of the electrically-conductive regions of the source electrode for a given (desired) fill factor of perforations. In other words, the given fill factor can be obtained with a larger number of small perforations. Moreover, as mentioned above the thickness of the patterned electrode should be selected to be as thinner as possible but on the other end has to have enough conductance properties to provide charge carrier to the entire electrode area.

Thus, the present invention, due to the ability to select wide range of materials for the source electrode, for the gate dielectric and for the active cell semiconductor (especially because of no bound by templates), allows for an optimal geometry of the pattern. More specifically, a larger number of smaller perforations can be used without affecting the electrical conductance of the patterned electrode while increasing the ratio between the charge carriers' injection to the active cell by the perforated regions of the source electrode and that of the conductive electrode regions between them. For example, the use of different electrically conductive materials (e.g. metals) enables to provide an appropriate energy barrier height for the OFF-current (i.e. carrier injection from the conductive electrode regions) to be as small as possible, and that of the energy barrier height for the ON-current (i.e. carrier injection from the perforated regions) as high as possible (higher than the injection properties of the active cell semiconductor). As will be described further below, this effect can be optimized by making the source electrode structure from two different materials one on top of the other where the upper material layer (i.e. that interfacing with the active cell) is less conductive than the lower one (e.g. insulating layer).

The selection of the electrically conductive material for the patterned electrode structure enables the device to be used with the wide range of materials. This is because the device operation is based on the Schottky barrier between the source electrode structure and the active cell. For example, patterned source electrode made of gold can be used with the active cell $C_{60}$ semiconductor (operating as n-type semiconductor); alternatively, the patterned source electrode may be made of silver or aluminum to be used with the active cell including Pentacene (operating as p-type semiconductor).

The present invention provides a method for use in manufacturing a vertical thin film transistor structure, the method comprising applying patterning to at least one of source electrode layer to create an array of spaced-apart perforations surrounded by continuous electrically conductive regions along said electrode, by using a block copolymer (BCP) material as a patterning mask (such that the final transistor structure has no BCP) to thereby enabling to determine the thickness of the patterned layer and the lateral size of the perforations. Preferably, a block copolymer is PS-b-PMMA. Generally, at least one of the following block copolymers can be used: polystyrene-block-poly(methyl methacrylate) (PS-PMMA), polystyrene-block-poly(ethylene oxide) (PS-PEO), polystyrene-block-poly(4-vinyl pyridine) (PS-P4VP), PS-P2VP, and polystyrene-block-poly(ferrocenyldimethylsilane) (PS-PFES). In some other embodiments, the organic material composition comprises at least two different organic materials which may phase separately. These may be polystyrene, poly(methyl methacrylate), and any combination of each with other polymers.

The use of a block copolymer (BCP) material as a patterning mask enables a wide selection of metal materials as well as the accurate controlling of the thickness of the patterned structure and of the lateral size of the perforations. Moreover, the use of the BCP material does not limit the selection of the dielectric material.

BCPs and their properties are generally known and therefore need not be described in details, except to note that, in some embodiments, the block copolymers have two distinct blocks (linear diblock copolymers). For practical reasons and for the sake of clarity, the phase separation is discussed and the followed structures are obtained in the simplest case of linear diblock copolymer AB. Linear diblock copolymer consists of two distinctive linear chains of monomers A and of monomers B that are attached in their edge to one another. When this material is in solid state or in melt, there is energetic balance that dictates whether phase separation will occur. Thermodynamically, a change will take place if it is energetically favored, meaning, when the Gibbs energy is negative ($\Delta G<0$).

Equation 2.1.1 describes the general Gibbs energy.

$$\Delta G=\Delta H-T\Delta S \qquad (2.1.1)$$

It is composed of two opposing parameters, $\Delta H$ the enthalpy and $\Delta S$ the entropy. The entropy pulls the system to the disordered phase as it lowers the Gibbs free energy; the enthalpy minimizes the Gibbs energy thru minimizing the interfaces between A block to B block. The phase behavior can be represented with morphology diagram in terms of f and $\chi N$, when f is the volume fraction of chain A of the whole AB chain, N is the polymerization degree and $\chi$ is the Flory-Huggins interaction parameter [3]. As a function of the parameters mentioned above, a few phase structures can be achieved: body centered cubic spheres, hexagonal-packed cylinders, gyroid (or double gyroid) and lamellae.

The two simplest and effective techniques to create the phase separation are Thermal Annealing (TA) and Solvent Annealing (SA). Thermal annealing includes heating the sample over the glass transition temperature (lowering enthalpic barriers) allowing a slow segregation of the polymer chains. This method is practical when above glass transition temperature the location of the material on the morphology diagram is still in the ordered area. The SA technique involves the introduction of third small molecules enabling movement of the polymer chains and reducing the energy loss caused by joints in the chain, which are the result of the incompressibility of the material.

In some embodiments, the block copolymer is polystyrene-polymethylmethacrylate (PS-PMMA) BCP.

Thus, according to one broad aspect of the invention, there is provided an electronic device comprising an electrically-conductive perforated patterned structure which is enclosed between a dielectric layer and an active element of the electronic device, said perforated patterned structure comprises a geometrical pattern defining an array of spaced-apart perforation regions surrounded by continuous electrically conductive regions, said pattern being such as to allow the active element of the electronic device to be in direct contact with said dielectric layer aligned with the perforation regions, a material composition of the device and features of said geometrical pattern being selected to provide a desired electrical conductance of the electrically-conductive perforated patterned structure and a desired profile of a charge carriers' injection barrier along said structure.

The patterned source electrode has anisotropic injection properties.

In some embodiments, the active element on top of the electrically-conductive perforated patterned structure comprises an organic or amorphous semiconductor material composition corresponding to an active cell of a thin film transistor structure, said electrically-conductive perforated patterned structure being one of a source and drain electrodes enclosed between the dielectric layer of a gate on dielectric structure and said active element. The transistor structure may be configured and operable as a vertical field effect transistor (VFET) structure with the source and drain electrodes arranged in a spaced-apart relationship in different layers, with the active element therebetween, one of said source and drain electrodes being said patterned perforated electrically-conductive structure.

The electrically conductive regions may be formed by one or more metals or semiconductors.

The features of said geometrical pattern comprise the following: a thickness of at least the electrically conductive layer structure, lateral dimensions of the perforation region and that of electrically-conductive surrounding, and a fill factor of perforations within the electrically-conductive structure.

The material composition is selected to provide a certain electrical conductivity profile across the source electrode, said certain electrical conductivity profile being selected to provide the desired charge carrier's injection. The desired material composition may be formed by a single material layer or a multi-layer structure.

In some embodiments, the geometrical pattern is formed by depositing at least one electrically conductive material on said dielectric layer via a patterning mask comprising a block copolymer layer, thereby enabling nano-scale features of the pattern and independent selection of materials for the electrically conductive patterned structure and the dielectric layer underneath said structure. The block copolymer may comprise PS-b-PMMA.

According to another broad aspect of the invention, there is provided a method for use in manufacturing a vertical thin film transistor structure, the method comprising applying patterning to at least one layer of a source electrode structure to create an array of spaced-apart perforations surrounded by the continuous electrically conductive regions along said electrode, said patterning utilizing a block copolymer material as a patterning mask to thereby enabling to provide a selected thickness of the patterned layer and lateral feature size of the pattern.

The patterning may create nano-scale pattern features. Said patterning may comprise the following: selecting an optimized relationship between the electrode layer thickness and the layer patterned perforations for a given selected dielectric layer thickness underneath the patterned electrode structure. The patterning is aimed at providing a desired electrical conductivity along the patterned electrode and desired charge carriers' injection barrier by appropriately selecting the source electrode material composition, geometry, and fill factor of the perforations.

In some embodiments, the selecting of the source electrode material composition comprises providing a single material layer or a multi-layer structure.

In some embodiments, the patterning comprises controlling evaporation of one or more electrically conductive materials and selecting a dielectric material of a desired dielectric permeability.

In some embodiments, the patterning comprises creating a phase separation of diblock copolymer into a first phase and a second phase; dissolving the first phase of the diblock copolymer; evaporating at least one electrically conductive material onto said patterned block copolymer serving as a patterning mask; dissolving the second phase of the block copolymer by performing a lift-off process for the conductive material to thereby remove the mask and create a patterned conductive layer.

The creation of the phase separation may comprise solvent annealing.

BRIEF DESCRIPTION OF THE DRAWINGS

In order to understand the invention and to see how it may be carried out in practice, embodiments will now be described, by way of non-limiting example only, with reference to the accompanying drawings, in which:

FIGS. 3A and 3C represent an example of the patterned perforated electrically-conductive structure provided by using the technique of the present invention; in particular

FIGS. 7A-7B represent a simulation of the charge density in biased and unbiased states.

DETAILED DESCRIPTION OF EMBODIMENTS

The present invention provides an electrically-conductive perforated patterned structure enclosed between a dielectric layer and an active element of the electronic device and having a geometrical pattern defining an array of spaced-apart perforation regions surrounded by electrically conductive regions (grid). The active element is in direct contact with the dielectric layer within the perforation regions. A material composition of the device and features of said geometrical pattern are selected to provide a desired electrical conductance of the electrically-conductive perforated patterned structure and a desired profile of a charge carriers' injection barrier along said structure.

The desired profile of the charge carriers' injection barrier is selected such that the charge injection barrier is lower for the area closer to the active layers gate dielectric layer and higher on the upper interface of the patterned electrode.

For example, the electrode thickness may be selected to be in the range of about 3 nm and 15 nm and provide lateral conductivity with perforation having a diameter being in the range of about 10 nm to 150 nm with a given fill factor larger than 20%.

As indicated above, the principles of the present invention are particularly useful in a vertical organic field effect transistor and is described below with respect to this specific but not limiting example. The patterned electrically conductive structure presents one of the source and drain electrodes, with no limitation to the scope of the invention is exemplified below with reference to the source electrode.

According to the invention, the device (VOFET) has a patterned source structure (single- or multi-layer structure) with anisotropic electric characteristics, a high conductance in the device plane (the so-called "lateral" direction) and semi-transparent behavior for the charge carriers' injection in the perpendicular direction, towards the active cell (along the device "channel" or "vertical" direction). These characteristics enable the ability to a charge to get to any point in the source layer and also enable the gate to influence the active layer. An appropriate control of the structure parameters enables to limit the dependence of the device operation on the underneath layer structure (patterned electrode interfacing the gate dielectric and active cell semiconductor) in particular regarding its roughness and thickness. The properties gained by this patterned electrode are high working frequency along with high ON-current.

Such a device can be manufactured by several known techniques such as conventional lithography and various soft lithography methods that are more suitable for the low cost mass production of such devices.

Figure 2A:
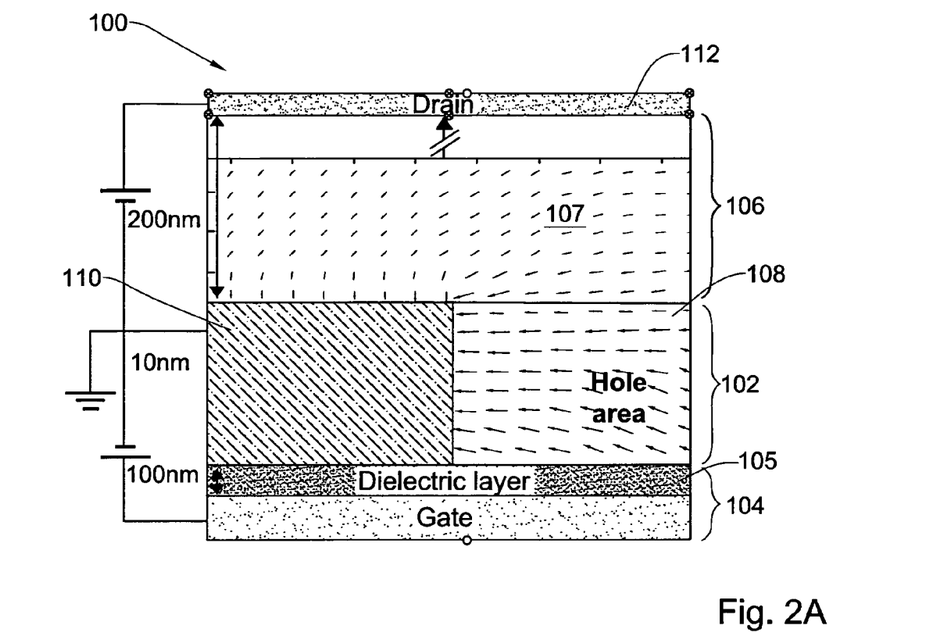
FIG. 2A is a schematic cross section diagram of the device of the present invention together with electric fields simulation plot of the device in biased state showing the lateral direction of the dominant electric field.

Reference is made to FIG. 2A exemplifying a VOFET device 100 configured and operable according to the invention. The VOFET 100 includes a patterned source electrode 102 enclosed between a gate on dielectric structure 104 and an active cell structure 106. The pattern in the source electrode structure 102 comprises an array of spaced-apart perforations, one such perforation 108 being shown in the figure, spaced by electrically conductive planar regions 110 of the electrode structure. A drain electrode 112 is located on top of the active cell structure. With this configuration, a dielectric layer 105 of the gate on dielectric structure 104 interfaces with the active cell organic semiconductor 107 via the patterned source electrode 102, being in direct contact with the organic semiconductor 107 at the perforated regions 108. The electric fields simulation plot of the device in biased state shows the lateral direction of the dominant electric field.

As indicated above, the parameters that are taken into account to optimize is the device operation include: as small as possible thickness of the dielectric layer 105 (e.g. thickness between 5 nm to 100 nm); sufficiently thin source electrode 102 (between 3 nm and 15 nm, depending on the conductive material of choice) to increase the gate effect while being sufficiently electrically conductive; a fill factor of the perforations 108 within the source electrode 102 and the lateral dimension of the perforation. These parameters are aimed at providing a desired ratio between the charge carriers' injection from the planar conductive and perforated regions of the source to the active cell.

In some embodiments, the patterned electrode has anisotropic injection properties. To take advantage of this phenomenon one would seek to have an electrode having anisotropic injection properties where the part of the electrode that is mainly exposed to the modulating signal (gate in this example) would have a closer to ohmic contact properties than the part (top in this example) that is mainly exposed to other signals in the device (drain source voltage in this example). In the present invention, such anisotropy is achieved by at least one of the followings procedures: selecting materials exhibiting different work functions at different facets of the film; inducing a suitable curvature that modifies the injection properties; creating a patterned layered structure.

For example, $C_{60}$ is selected as the organic material to be the active element of the electronic device. $C_{60}$ functions as n-type semiconductor and has mobility values for gold contacts and silicon dioxide insulator layer as high as 0.5 [cm$^2$ v$^{-1}$ s$^{-1}$] [4] and up to 2 [cm$^2$ v$^{-1}$ s$^{-1}$] for silver contacts and BCP insulating layer.

Figure 2B:
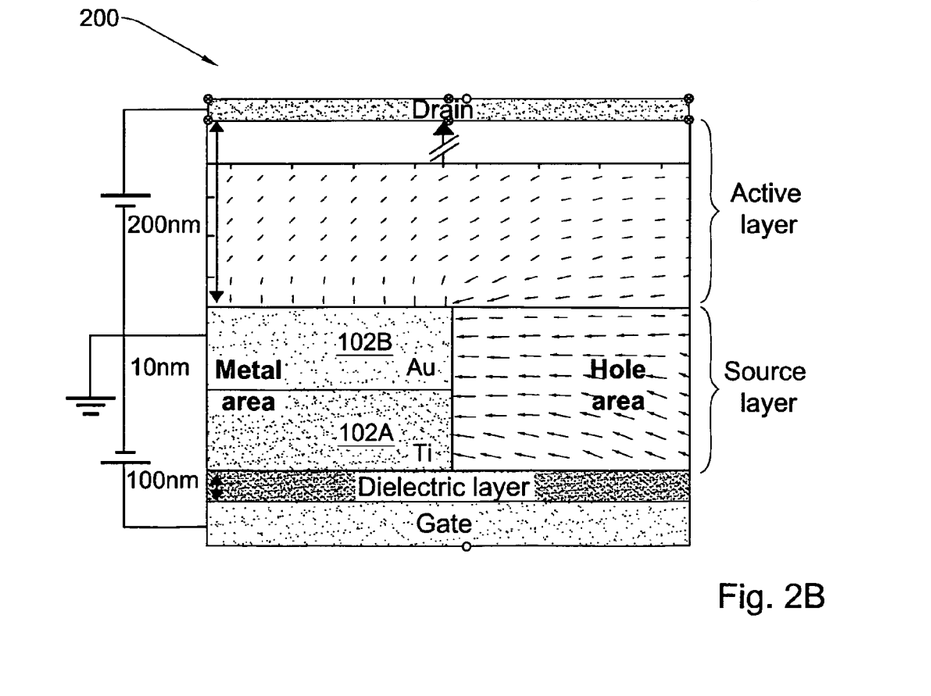
FIG. 2B represents an example of another configuration of the device of the present invention.

Reference is made to FIG. 2B illustrating another example of the VOFET device, designated 200, of the present invention. This device is generally similar to the above-described VOFET 100, but differs therefrom in that the patterned electro-conductive perforated electrode 102 comprises more than one layer, two layers 102A and 102B in the present example, made of materials of different electrical conductivity. The materials are selected such that the top layer 102B is made of a material having lower injection properties than the active cell 106, and the bottom layer 102A which is of higher conductivity than layer 102B is made of a material having higher injection properties than the active cell 106. This concept can be enhanced to more than two layers.

The different conducting materials have generally different work function properties. As the work function value of the metal is lower than that of the lowest unoccupied molecular orbital (LUMO) level of the active element, the barrier for electron injection is higher. For example, Gold (Au) and titanium (Ti) are selected to be the different conductive materials. The top layer may be made of Au having a work function of about 5.1 eV and the bottom layer may be made of Ti having a work function of about 4.3 eV. The active layer may be made of C60 having a LUMO level around 4.5 eV. The energy level difference between the Au layer and the C60 layer is negative and reduces the electron injection to the C60 layer. The energy level difference between the Ti layer and the C60 layer is positive and increases electron injection to the C60 layer.

The same idea and concept can be applied in other ways as well, by creating a layered source with different materials than described above and/or with more than two layers. For example, the top layer material may be selected to be an insulating material, reducing the OFF-current to a practically negligible value. Selecting a bottom layer having a lower work function with ohmic characteristics contact than the $C_{60}$ provides high ON-current values.

The layered patterned structure also enables to improve the device frequency performance. Selecting an insulating material in the top layer allow the selection of an active element having a smaller thickness due to prevention of short circuit between the source and the drain metal layer. The thinner active element enables to increase the ON-current and the device working frequency, this with no foreseeable damage to the OFF-current.

Figure 3A:
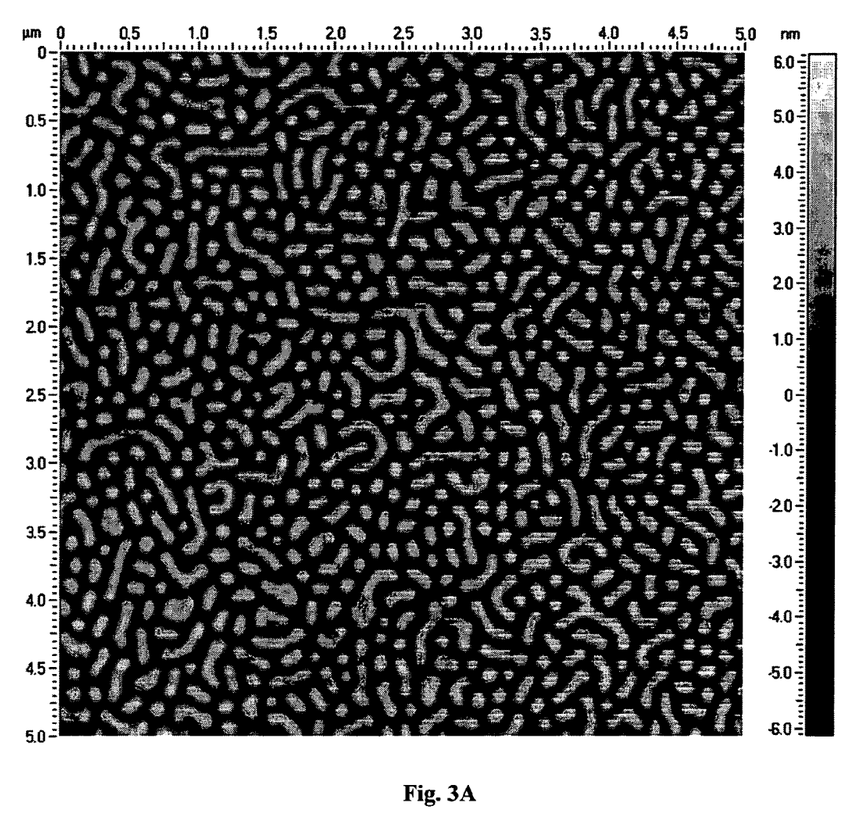
FIG. 3A is an AFM image of the phase separated block copolymer of the PS-PMMA, (before metal deposition)
Figure 3B:
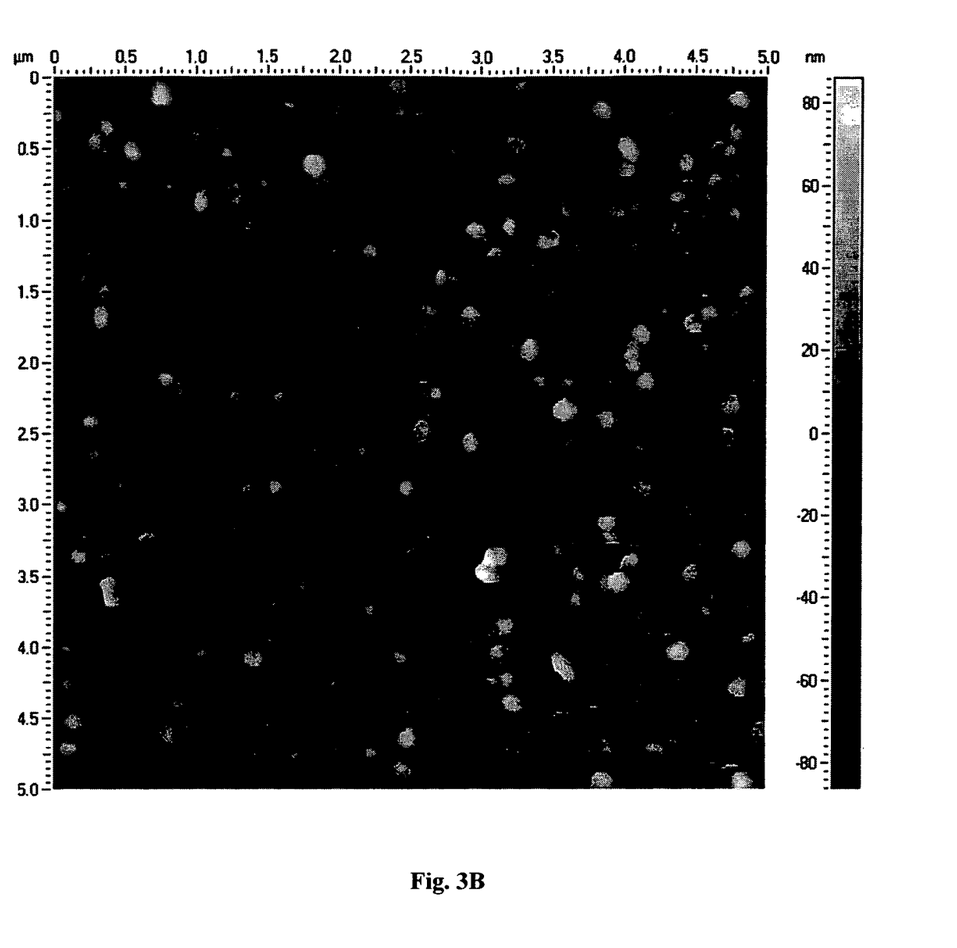
FIG. 3B represents the patterned mask after removing the PMMA phase. Only PS cylinders are left on the dielectric layer which serves as the lift-off mask for the later metal deposition.
Figure 3C:
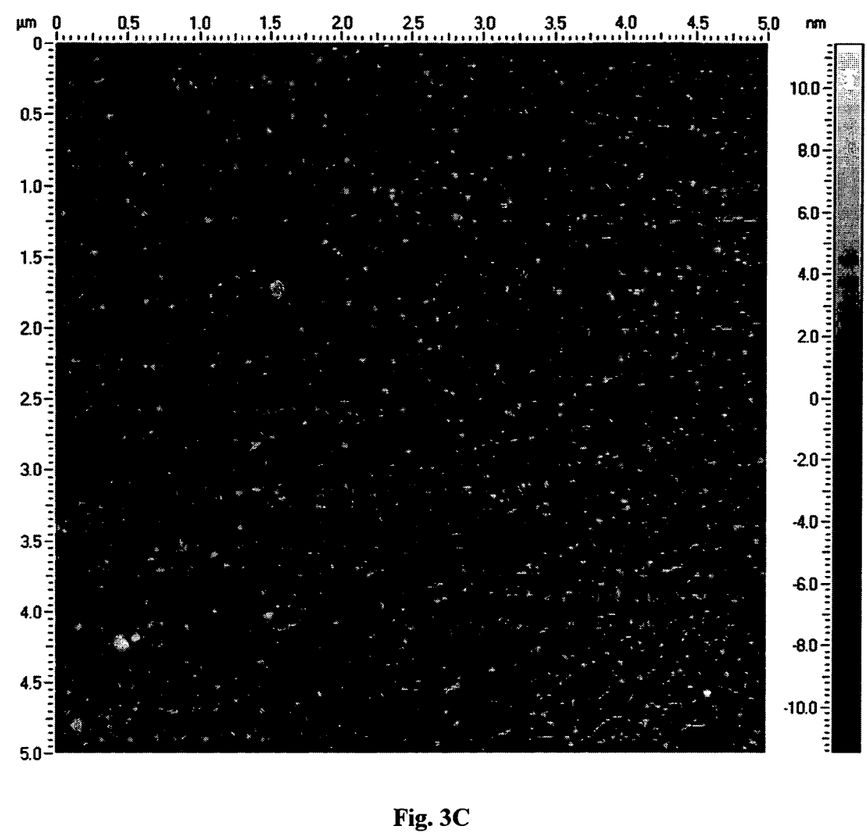
FIG. 3C represents the patterned electrode achieved through deposition of metal over the PS patterned mask and lift-off process.

FIGS. 3A and 3C show the patterned perforated electrically-conductive structure provided by using the technique of the present invention.

In particular, FIG. 3A is an AFM image of the phase separated block copolymer of the PS-PMMA, (before metal deposition). FIG. 3B represent a required step in which one of the phases of the diblock copolymer, in this case the PMMA phase, is being removed leaving behind only the PS pattern on the dielectric layer as the lift-off mask for the later metal deposition. FIGS. 3A and 3B are different in the depth of the obtained features in the image, in FIG. 3A from (−6) nm to 6 nm, in FIG. 3B from (−90) nm to 90 nm. In FIG. 3B the darker parts are the $SiO_2$ under the patterned PS while in FIG. 3A the darker parts are the PMMA phase.

FIG. 3C represents the patterned electrode achieved through deposition of metal over the PS patterning mask and lift-off process. The brighter parts are the metal grid and the dark holes (perforations) are the $SiO_2$. It should be understood that the invention actually does not require any periodicity of the pattern (e.g. electrically conductive regions of the grid). The thickness of this particular net is 7.5 nm (measured by AFM). Resistance of 100 Ohm/mm has been measured for a layer having a thickness of less than 7 nm.

The method of patterning can be achieved as follows: first, thin layer of BCP is spin-cast on a silicon oxide surface and then inserted into a Solvent Annealing (SA) chamber. In the presence of various gases, the morphology of the BCP changes and an order-disorder phase point is achieved. The method of the present invention forces only microscopic phase separation order, as illustrated in FIG. 3A, which is an AFM image of the Ps-PMMA surface after the solvent annealing process. The different colors represent different regions in the polymer.

The second step is to create a patterned metal layer based on the BCP patterning by means of UV exposure and lift-off process. In the first process, the PMMA phases are dissolved as illustrated in FIG. 3B, and then metal layer is thermally evaporated onto the surface. A second lift-off process follows when the PS is dissolved along with the metal covering it the result of which is shown in FIG. 3C which is an AFM image after the lift-off process. The evaporation thickness is approximately 7.5 nm.

Figure 4:
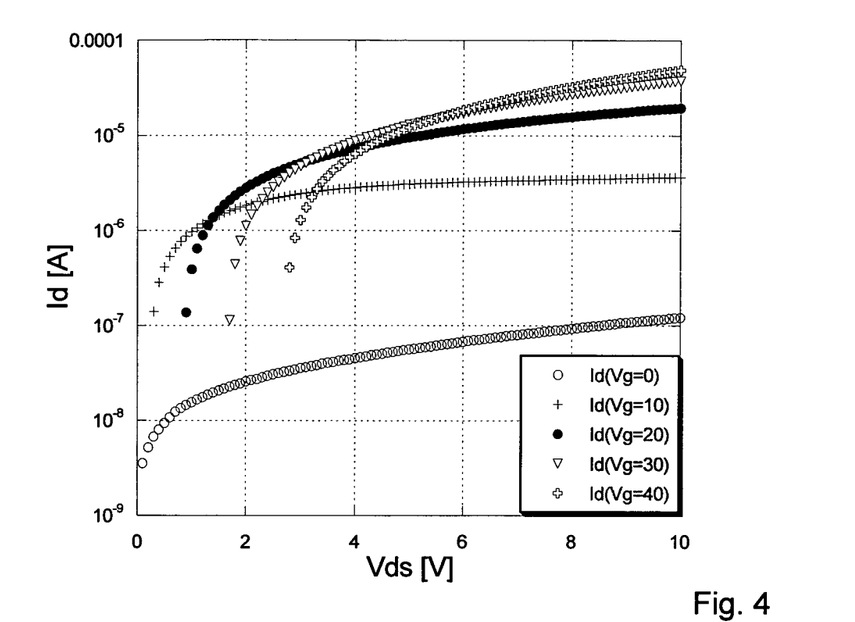
FIG. 4 represents Id vs. Vds for different Vg's for the device of the present invention.
Figure 5A:
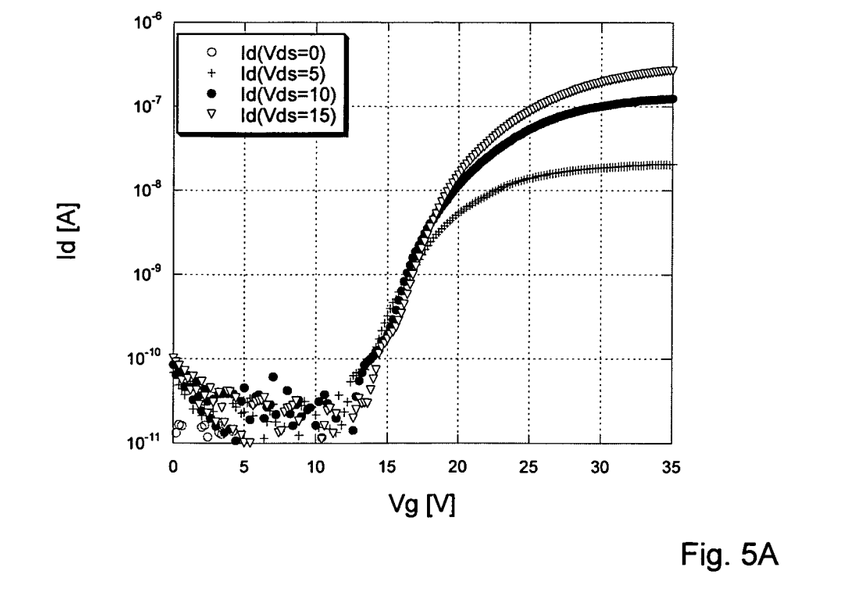
FIGS. 5A-5B represent Id vs. Vg for different Vds's for the device of the present invention.
Figure 5B:
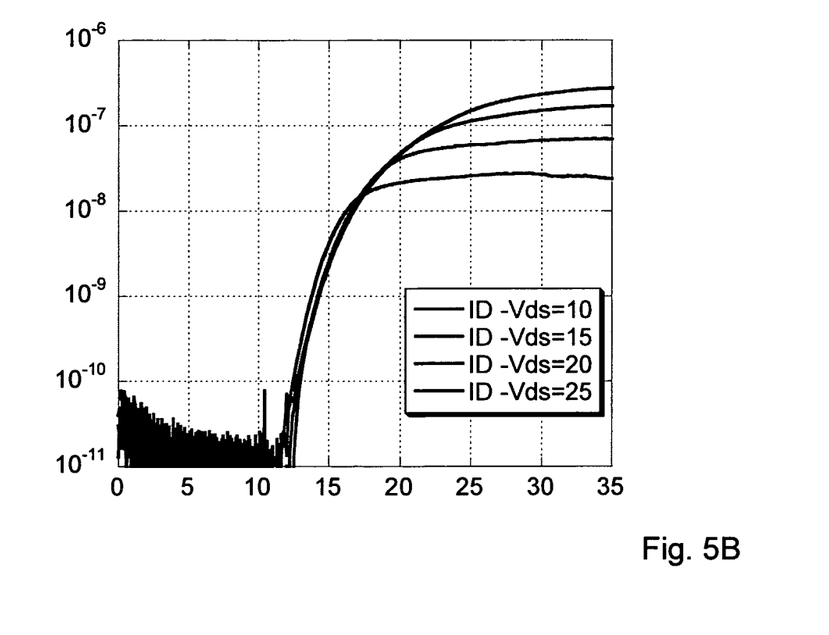

Reference is made to FIG. 4 graphically representing the ON-current Id as is a function of the voltage applied between the drain and the source (Vds) for different voltage gate (Vg). The results are intermediate device results showing a high on/off ratio ($1 \times 10^4$) and high ON-current (in the range of hundreds of $mA/cm^2$). Such results are very initial results, before any optimization process which probably will significantly improve the transistor properties. An example of the ON-current as a function of Vg for Vds is exhibited in FIG. 5A and ON/OFF-current on FIG. 5B.

Figure 6:
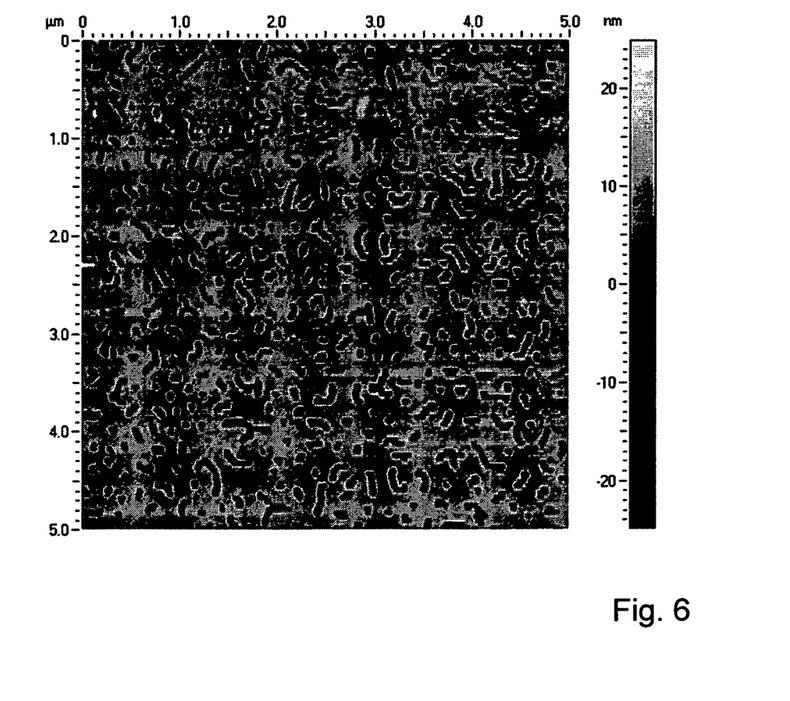
FIG. 6 is an AFM topographic analysis after lift-off process of 20 nm metal layer over a geometric engineered BCP layer.

Reference is made to FIG. 6 representing an AFM image of the patterned metal layer after a lift-off process of 20 nm over a geometrically engineered BCP patterning mask layer (e.g. metal grid). More arranged array of perpendicular PS cylinders has been obtained by reducing the BCP layer thickness and result with a better metal grid. The perpendicular cylinders enable more control over measurable parameters of the electrode and better conductance along the layer. The electrode parameters of interest are the layer thickness, the fill factor (FF) which is defined as the ratio of the perforations/holes area to the rest of the layer and the lateral size of the perforations/holes. For example, the fill factor may be selected to be in the range of about 20%-50%.

The size of perforations/holes may be controlled through various methods such as a UV exposure in the stage of the PMMA removal, and/or an etching procedure of the PS cylinders to provide thinner PS cylinders, enabling to create perforations having a smaller lateral size. Alternatively or additionally, the BCP layer may be selected such that block size of the BCP can also be varied accordingly. More specifically, different BCP size (chain length) and a larger number of perforations can be obtained for the same value of FF. For a given fill factor, a larger number of small perforations can be obtained.

The active layer may be formed by C60 small particle material which is thermally evaporated over the source electrode. Top contacts are thermally evaporated over the C60 layer which concludes the device fabrication.

Figure 7A:
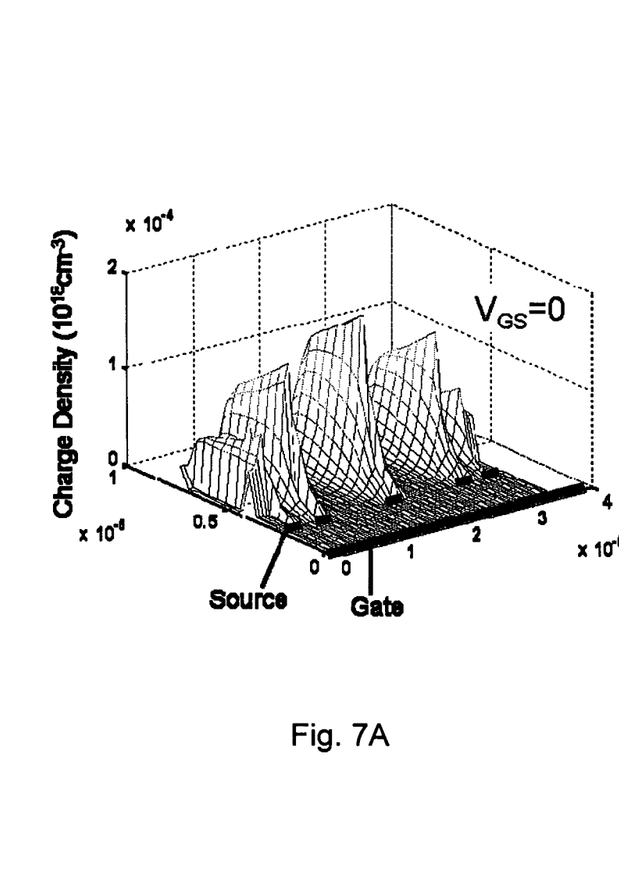
FIG. 7A represents a charge density for the case of unbiased gate.
Figure 7B:
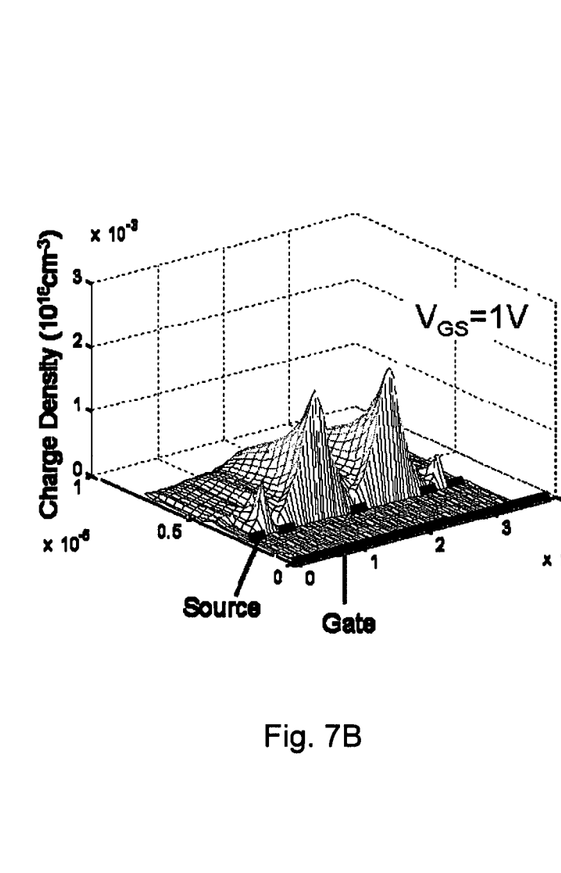
FIG. 7B represents charge density for the case of biased gate.

Reference is made to FIGS. 7A and 7B illustrating a simulation of the device of the present invention configured as in FIG. 2B. FIGS. 7A and 7B represent the charge density in unbiased state (7A) and biased state (7B) and produced by simulation in MatLab program, showing the spatial location of the channel in different gate biases. When the gate is not biased, the location of the channel is originated from the upper facet of the patterned electrode in vertical direction and low density values. As described above, the electric field between the drain and the electrically conductive regions of the source is relatively low, relative to the electric fields induced by the gate which are responsible to the ON-current. The electric field between the drain and the electrically conductive regions of the source is to be kept low enough so as not to lower the Schottky barrier and thus not to extract significant amount of charges from the source electrode.

FIG. 7B represents the charge density when the gate is biased. When the gate is biased, a much larger carrier concentration which is referred as the channel is created in the area of the perforations/holes (the area between the metal parts of the source). Detailed investigation of the electric fields regime in the area of the patterned source reveals a strong variation in size and direction between the two states of the transistor, the ON state (when the gate is biased) and the OFF state (when the gate is not biased).

The invention claimed is:

1. An electronic device, comprising:
a transistor structure that includes a dielectric layer, an active element, and an electrically-conductive structure which is positioned between the dielectric layer and the active element,
said electrically-conductive structure including a perforated electrode formed by at least two layers of different material compositions, said at least two layers comprising at least a top layer having lower injection properties and at least a bottom layer having higher injection properties, the perforations in said electrode forming a geometrical pattern of selected features defining an array of spaced-apart perforation regions located between continuous electrically conductive regions,
the material composition and the selected features of said geometrical pattern providing a desired electrical conductance of the patterned electrode and a desired profile of a charge carriers' injection barrier along said electrically-conductive structure.

2. The device of claim 1, wherein said active element is on top of the perforated patterned electrode, said active element comprising an organic or amorphous semiconductor material composition, said perforated patterned electrode being one of source and drain electrodes positioned between the dielectric layer of a gate on a dielectric structure and said active element.

3. The device of claim 2, wherein said transistor structure is configured and operable as a vertical field effect transistor (VFET) structure with the source and drain electrodes arranged in a spaced-apart relationship in different layers, with the active element therebetween, one of said source and drain electrodes being said patterned perforated electrically-conductive structure.

4. The device of claim 1, wherein said material composition of the perforated electrode comprises at least one of the following: metal, semiconductor and insulator materials.

5. The device of claim 1, wherein the features of said geometrical pattern comprise a thickness of at least the electrically conductive layer structure, lateral dimensions of the perforation region and that of electrically-conductive surrounding, and a fill factor of perforations within the electrically-conductive structure.

6. The device of claim 1, wherein said material composition is selected to provide a certain electrical conductivity profile across the source electrode, said certain electrical conductivity profile being selected to provide the desired charge carrier's injection.

7. The device of claim 6, wherein said material composition comprises a single material layer or a multi-layer structure.

8. The device of claim 1, wherein said patterned source electrode has anisotropic injection properties.

9. An electronic device, comprising:
a transistor structure that includes a dielectric layer, an active element, and an electrically-conductive structure which is positioned between the dielectric layer and the active element,
said electrically-conductive structure including a perforated electrode formed by one or more layers of one or more selected material compositions, the perforations in said electrode forming a geometrical pattern of selected features defining an array of spaced-apart perforation regions located between continuous electrically conductive regions,
the material composition and the selected features of said geometrical pattern providing a desired electrical conductance of the patterned electrode and a desired profile of a charge carriers' injection barrier along said electrically-conductive structure,
wherein said geometrical pattern is formed by depositing at least one electrically conductive material on said dielectric layer via a patterning mask comprising a block copolymer layer, thereby enabling nano-scale features of the pattern and independent selection of materials for the electrically conductive patterned structure and the dielectric layer underneath said structure.

10. The device of claim 9, wherein said block copolymer comprises PS-b-PMMA.

* * * * *